(12) United States Patent
Hamada

(10) Patent No.: US 7,160,812 B2
(45) Date of Patent: Jan. 9, 2007

(54) METHOD FOR PREVENTING ELECTRODE DETERIORATION IN ETCHING APPARATUS

(75) Inventor: Hideshi Hamada, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 38 days.

(21) Appl. No.: 10/361,823

(22) Filed: Feb. 11, 2003

(65) Prior Publication Data

US 2004/0014324 A1 Jan. 22, 2004

(30) Foreign Application Priority Data

Jul. 16, 2002 (JP) ............................. 2002-206640
Jan. 24, 2003 (JP) ............................. 2003-015680

(51) Int. Cl.
*H01L 21/302* (2006.01)
*H01L 21/3065* (2006.01)
*C25F 3/30* (2006.01)

(52) U.S. Cl. .................. 438/706; 156/345.1; 134/1.1; 134/1.2

(58) Field of Classification Search ................ 438/706; 156/345; 134/1.1, 1.2
See application file for complete search history.

(56) References Cited

U.S. PATENT DOCUMENTS 5,868,848 A * 2/1999 Tsukamoto ............. 118/723 E
5,986,874 A * 11/1999 Ross et al. ................... 361/234
5,990,016 A * 11/1999 Kim et al. ................... 438/707
6,057,247 A * 5/2000 Imai et al. .................. 438/714
6,123,805 A * 9/2000 Kim et al. ............. 156/345.43
6,241,845 B1 * 6/2001 Gadgil et al. .......... 156/345.37

FOREIGN PATENT DOCUMENTS

| JP | 06314675 A | 11/1994 |
| JP | 08-111398 | 4/1996 |
| JP | 08-181112 | 7/1996 |
| JP | 10-032187 | 2/1998 |
| JP | 63-055193 | 3/1998 |
| JP | 2001244239 A * | 9/2001 |

OTHER PUBLICATIONS

NEC Corp. [NIDE], Dry etching apparatus . . . to form plasma of cleaning gas supplied through holes chamber, by electrodes, Sep. 7, 2001, Computer-generated, English Abstract of JP 2001244239 A, 3 pages.*
NEC Corp. [NIDE], Dry etching apparatus . . . to form plasma of cleaning gas supplied through holes chamber, by electrodes, Sep. 7, 2001, Computer-generated, English translation of JP 2001244239 A, 8 pages.*

* cited by examiner

*Primary Examiner*—Nadine Norton
*Assistant Examiner*—Lynette T. Umez-Eronini
(74) *Attorney, Agent, or Firm*—VolentineFrancos&Whitt,PLLC

(57) ABSTRACT

A method for preventing the deterioration of an electrode caused by the build up of deposits in openings of the electrode. Gas is supplied to each of the openings in order to prevent deposits from adhering to the openings before or after the etching treatment.

15 Claims, 8 Drawing Sheets

METHOD FOR PREVENTING ELECTRODE DETERIORATION IN ETCHING APPARATUS

BACKGROUND OF THE INVENTION

1. Field of the Invention

The present invention relates to a method for preventing electrode deterioration in an etching apparatus used in the manufacture of semiconductors.

2. Description of Related Art

FIGS. 7A, 7B, 8A, and 8B illustrate a series of conventional treatment steps performed in a reaction chamber 10 of an etching apparatus used in the manufacture of semiconductors. The structure of the reaction chamber 10 will be described through reference to FIGS. 7A to 8B.

As shown in FIG. 7A, the reaction chamber 10 of the etching apparatus comprises in its interior an electrode 12 and a discharge component 14. The discharge component 14 is provided facing the electrode 12, and a high-frequency power supply (RF power supply) 16 is connected.

As is commonly known, the etching gas is usually introduced into the reaction chamber 10 through a plurality of vents made in the discharge component 14. When a high-frequency voltage is applied from the RF power supply 16 to the discharge component 14, whose vents are not shown in FIG. 7A, a plasma is generated between the discharge component 14 and the electrode 12. The high-frequency voltage is sometimes applied to the electrode 12.

The plasma thus generated is used to perform etching in the reaction chamber 10. This etching treatment will now be described.

First, the steps shown in FIGS. 7A and 7B will be described. As shown in FIG. 7A, a substrate 26 is put in place on the electrode 12 after being transferred from a load lock chamber (not shown) into the reaction chamber 10. Specifically, the substrate 26 is fixed on the electrode 12 by a clamping apparatus 28 or other such means. FIG. 7A shows how the substrate 26 is fixed on the electrode 12 by clamping the ends of the substrate with this clamping apparatus 28. In the steps discussed below, the fixing of the substrate 26 is accomplished in the same manner as shown in FIG. 7A.

The electrode 12 has a plurality of openings 24. These openings 24 are each connected to a gas line 22. As shown in FIG. 7A, the gas line 22 comprises a cooling gas line 20, and an exhaust line 18 connected to the cooling gas line 20 via a fourth valve 32. A turbo pump (TP) 40 and an exhaust valve 42 provided between this turbo pump 40 and the reaction chamber 10 are installed along the exhaust line 18. When this exhaust valve 42 is open, the exhaust gas inside the reaction chamber 10 is purged by the turbo pump 40.

Meanwhile, the cooling gas line 20 is connected between a cooling gas source (not shown) and the plurality of openings 24. This cooling gas line 20 is provided with a master valve 21, a pressure gauge 38, a mass flow controller (hereinafter referred to simply as MFC) 36, and a third valve 30, sequentially from the cooling gas source side to the openings 24 side. The above-mentioned fourth valve 32 is provided to a gas passage line (branched line) 23 that connects, or links, the third valve 30 of the cooling gas line 20 and the openings 24, and the exhaust valve of the exhaust line 18 and the turbo pump 40.

The substrate 26 is installed on the electrode 12. With the fourth valve 32 closed, cooling gas is supplied from the cooling gas line 20 to each of the plurality of openings 24. Usually, when the substrate 26 is being etched, the surface temperature of the substrate 26 is raised by heat from the plasma and the reaction heat of the etching, which causes the etching rate to vary and results in an uneven etching rate over the surface of the substrate 26. The third valve 30 is installed along the cooling gas line 20. Opening this third valve 30 and supplying cooling gas prevents the etching rate from becoming uneven as discussed above. The mass flow controller (hereinafter referred to as MFC) 36 and a pressure gauge 38 are installed along the cooling gas line 20, and the cooling gas flux and pressure in this cooling gas line 20 are controlled by the MFC 36 and the pressure gauge 38. Helium (He) or another rare gas is generally used as the cooling gas.

The master valve 21, the third valve 30, the fourth valve 32, and the exhaust valve 42 shown in FIGS. 7A and 7B are shown white when in an open state and black when closed. Similarly, the open and closed states of the valves 21, 30, 32, and 42 are shown white or black in FIGS. 8A and 8B. The structure of the gas line 22 is the same in FIGS. 7A, 7B, 8A, and 8B.

As discussed above, the film provided on the surface of the substrate 26 is etched in a state in which cooling gas is supplied from the plurality of openings 24 to the rear face of the substrate 26 fixed on the electrode 12. FIG. 7B shows how this film is etched on the surface of the substrate 26 using a plasma 34 generated by the procedure detailed above. The third valve 30 is open and the fourth valve 32 is closed along the gas line 22 shown in FIG. 7B.

Next, the treatment performed after the step in FIG. 7B will be described through reference to FIGS. 8A and 8B. The application of the high-frequency voltage and the supply of the etching gas into the reaction chamber 10 are halted to conclude the etching of the substrate 26. After this, as shown in FIG. 8A, the third valve 30 is closed and the supply of cooling gas to the openings 24 is shut off. The fourth valve 32 is opened, meanwhile, and the cooling gas between the third valve 30 and the openings 24 is purged to the exhaust line 18.

Then, as shown in FIG. 8B, with both the fourth valve 32 and the third valve 30 closed, the clamping apparatus 28 is released, and the etched substrate 26 is conveyed from the reaction chamber 10 to an unloading chamber (not shown). The series of etching operations to which the substrate 26 is subjected is complete at this point.

The etching of substrates is carried out repeatedly in the reaction chamber of the etching apparatus by the procedure described above. While an etched substrate is being conveyed to the unloading chamber, that is, during the so-called non-etching period between one etching treatment and the next, the surface of the electrode is exposed inside the reaction chamber. The openings in the electrode are also exposed inside the reaction chamber during this time.

In this state, there is a fear that components separated from the reaction product generated during etching will be adsorbed to these openings. There is also another fear that the openings will be plugged when the above-mentioned separated components build up on the electrode and these deposits fall or find their way into the openings.

The size, number, layout, and so forth of the openings in the electrode are designed ahead of time according to the uniformity of substrate etching and other such characteristics. Therefore, if deposits adhere to the openings as mentioned above, the size of the openings will change, and as a result there will be a substantial change in the number, layout, and other aspects of these openings. As a result, the efficiency at which the substrate is cooled during etching in the reaction chamber decreases, resulting in a change in the etching characteristics.

SUMMARY OF THE INVENTION

The present invention was conceived in light of the above problems, and it is therefore an object of the present invention to provide a method for preventing the deterioration of an electrode due to the build-up of deposits in openings.

With the method of the present invention for preventing electrode deterioration, deposits are prevented from adhering in a plurality of openings in the electrode by sending a gas through the openings before or after the etching that is to be performed at the present time. The gas sent through these openings is supplied through a gas line.

For instance, while a substrate is being conveyed after undergoing a specific etching process, the reaction chamber is in a state in which no etching is being performed, and the electrode surface at this point is exposed inside the reaction chamber, as described above. With the method of the present invention for preventing electrode deterioration, deposits can be effectively prevented from adhering to a plurality of openings by spraying any suitable gas at these openings during the non-etching period.

Also, a discharge component is provided facing the electrode in the reaction chamber of an etching apparatus having a favorable mechanism for preventing electrode deterioration by the application of the method described above. In this etching apparatus, the above-mentioned method of the present invention for preventing electrode deterioration is performed after a substrate has been etched using a plasma generated between the discharge component and the electrode.

As mentioned above, the electrode deterioration prevention method of the present invention prevents deposits from adhering to the plurality of openings made in the electrode. Thus, if an electrode deterioration prevention mechanism that allows the method of the present invention to be carried out is provided to an etching apparatus, changes in the size, number, and layout of the plurality of openings in the electrode are suppressed, and therefore any decrease in the cooling efficiency of the substrate during the etching performed in the reaction chamber, and any deterioration in the electrode that would be caused by a change in the etching characteristics can be prevented.

In implementing the present invention, it is preferable for the etching apparatus to be equipped with an electrode deterioration prevention mechanism structured as follows.

An electrode that is provided to the reaction chamber of the etching apparatus, comprising:

an electrode that supports a substrate being etched and has a plurality of openings, and a gas line for sending gas to each of the openings in order to prevent deposits from adhering to the openings.

The gas line includes:

a gas supply line communicating with each of the openings, and an exhaust line connected to a gas supply line for purging the exhaust gas or gas in the reaction chamber.

The gas may preferably be a cooling gas.

The gas supply line is equipped with a mass flow controller (hereinafter referred to as MFC) that keeps the flow of the cooling gas between $1.69 \times 10^{-1}$ and $8.45 \times 10^{-1}$ (Pa (m$^3$/s)).

The gas supply line is equipped with a first valve and a second valve which are used for pre-charging the cooling gas into the gas supply line.

When the gas is a cooling gas,
the gas supply line includes:
a first cooling gas line that supplies cooling gas, and
a second cooling gas line that is connected to the first cooling gas line and has first and second valves used for pre-charging the cooling gas.

The gas may preferably be a cleaning gas.

The gas supply line includes:

a cooling gas line for supplying cooling gas, and a cleaning gas line that is connected to the cooling gas line and supplies cleaning gas to each of the openings.

The openings have a tapered shape, such that the width of the openings continuously increases toward the side of the electrode facing the substrate.

An etching apparatus preferably has an electrode deterioration prevention mechanism, and is equipped with a discharge component provided facing the electrode in the reaction chamber, for generating a plasma used for etching between the discharge component and the electrode.

An etching method comprises providing a discharge component facing an electrode in a reaction chamber, and preventing electrode deterioration after the plasma generated between the discharge component and the electrode is used to etch a substrate.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

With reference to the drawings, embodiments of the present invention will now be described hereinbelow. The various drawings mentioned in the following description are nothing but simplified depictions of the constituent elements, intended to facilitate an understanding of the present invention, and it should therefore be understood that the present invention is not limited to the depicted examples alone. Those constituent elements that are the same in the various drawings are numbered the same, and redundant descriptions thereof will be omitted except when special explanation is necessary.

First Embodiment

Figure 1A:
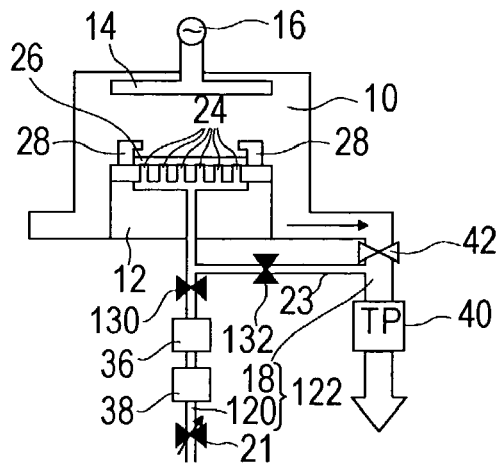
FIGS. 1A, 1B, and 1C are flow diagrams of the treatment steps in a first embodiment of the electrode deterioration prevention method of the present invention.
Figure 1B:
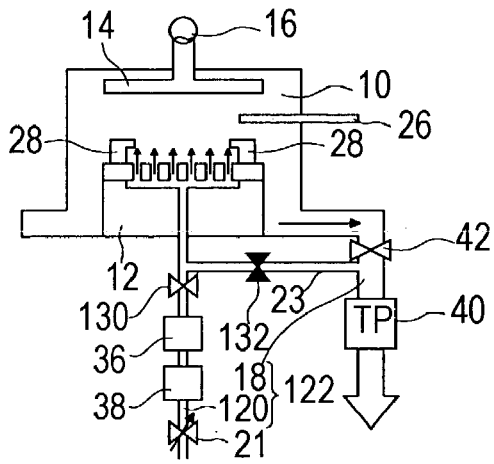
Figure 1C:
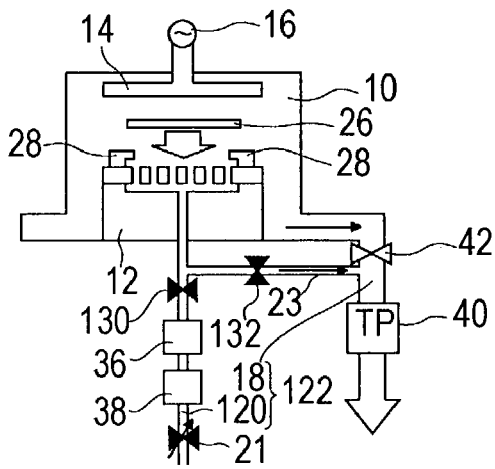

A first embodiment of the present invention will be described. FIGS. 1A, 1B, and 1C are flow diagrams of the steps in the first embodiment. First, the constitution of the first embodiment will be described through reference to FIG. 1A. The constitution shown in FIGS. 1B and 1C is the same as that described below.

The electrode deterioration prevention mechanism in the first embodiment is provided to a reaction chamber 10 of an etching apparatus. With the constitution shown in FIG. 1A, the electrode deterioration prevention mechanism in the first embodiment comprises an electrode 12 provided inside the reaction chamber 10, and a gas line 122. The electrode 12 supports a substrate 26 that is to be etched, and has a plurality of openings 24. The reaction chamber 10 and the gas line 122 have the same constituent elements as in the conventional example shown in FIGS. 7 and 8. Thus, those constituent elements that are the same as in the conventional example shown in FIGS. 7A, 7B, 8A and 8B are numbered the same as in FIGS. 1A, 1B, and 1C, and redundant description will be omitted.

As already described through reference to FIGS. 7A, 7B, 8A and 8B, the substrate 26 here is preferably fixed on the electrode 12 by some means such as a clamping apparatus 28.

The gas line 122 comprises a gas supply line 120 that is connected to each of the openings 24, and an exhaust line 18 that is connected to this gas supply line 120 via a sixth valve 132. In the first embodiment, the exhaust line 18 is preferably constituted the same as described above through reference to FIGS. 7A, 7B, 8A and 8B. Redundant description of the exhaust line 18 will therefore be omitted. The gas supply line 120 also doubles as a cooling gas line. The cooling gas line 120 in the first embodiment will be described in detail below.

The operation of the various constituent elements of the electrode deterioration prevention mechanism in the first embodiment will now be described through reference to the flow diagrams of FIGS. 1A, 1B, and 1C. The steps illustrated in FIGS. 1A to 1C will now be described for a case in which these steps are performed subsequently to the series of etching steps described through reference to FIGS. 7A, 7B, 8A and 8B.

The process carried out upon completion of the series of etching steps described through reference to FIGS. 7A, 7B, 8A and 8B (that is, the non-etching period in which no etching is performed) will be referred to as the post-etching process. The process prior to the series of etching steps described through reference to FIGS. 7A, 7B, 8A and 8B (that is, the non-etching period in which no etching is performed) will be referred to as the pre-etching process.

The unloading chamber and load lock chamber are not shown in FIGS. 1A to 1C.

With the first embodiment, the cooling gas line 120 shown in FIG. 1A is connected between a cooling gas supply line (not shown) and the openings 24. The gas line 120 has the same structure and the same operating function as the cooling gas line 20 shown in FIGS. 7A, 7B, 8A and 8B. Specifically, during etching, cooling gas is supplied from a gas supply source to each of the openings 24 through the cooling gas line 120 in order to cool the substrate 26. A fifth valve 130 is installed along the cooling gas line 120. The cooling gas is supplied to the openings 24 through the open fifth valve 130. Just as with the cooling gas line 20 shown in FIGS. 7A, 7B, 8A and 8B, it is preferable if an MFC 36 and a pressure gauge 38 are installed upstream from the fifth valve 130 (on the gas supply source side) along the cooling gas line 120 in the first embodiment. The configuration makes it possible for the flux and pressure of the cooling gas in the cooling gas line 120 to be kept at favorable levels by the MFC 36 and the pressure gauge 38. It is also preferable for the cooling gas used in the first embodiment to be a rare gas, just as in the conventional example described through reference to FIGS. 7A, 7B, 8A and 8B.

Figure 8A:
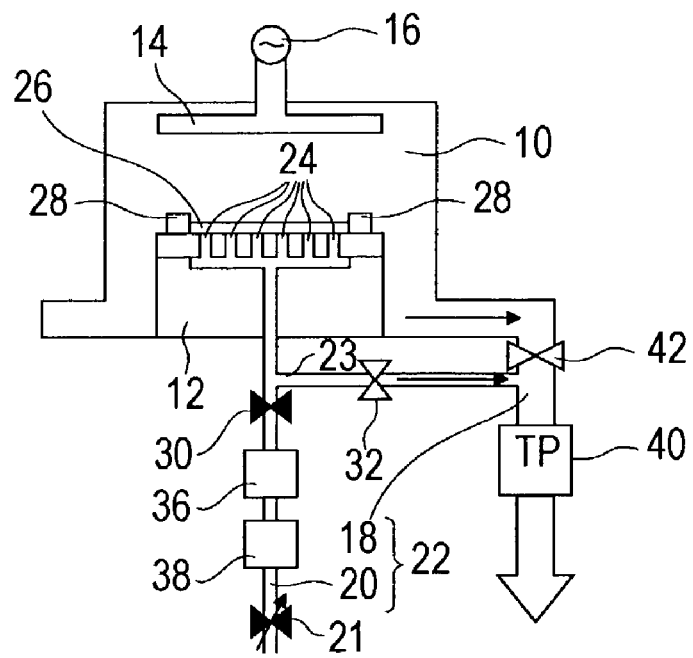
FIGS. 8A and 8B are flow diagrams continuing from FIG. 7B.
Figure 8B:
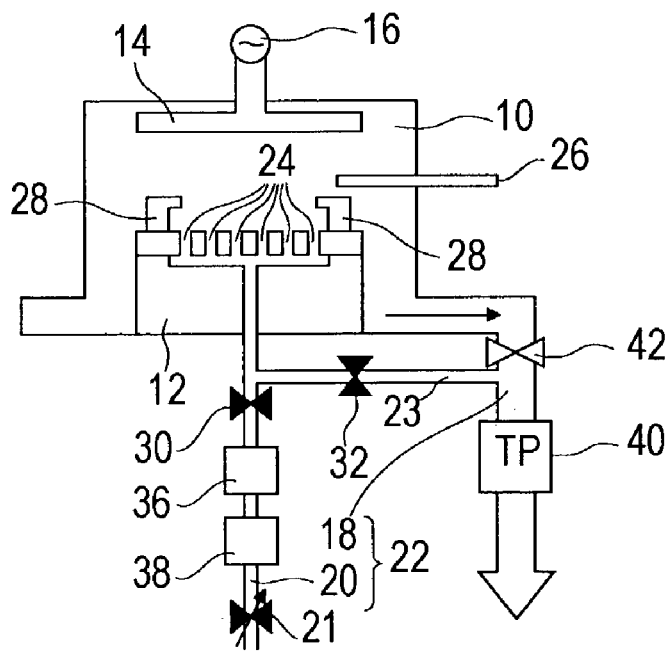

FIG. 1A illustrates the step immediately following the step described through reference to FIG. 8A above. As shown in FIG. 1A, with the master valve 21, the fifth valve 130 and the sixth valve 132 closed, the exhaust valve 42 is opened and the turbo pump 40 is actuated to purge the cooling gas from reaction chamber 10. The etched substrate 26 is then unclamped by the clamping apparatus 28 by which it had been fixed on the electrode 12.

The various valves in FIGS. 1A to 1C are shown white when in an open state and black when closed, just as in FIGS. 7A, 7B, 8A and 8B.

Following the step shown in FIG. 1A and discussed above, the step in FIG. 1B is performed. In FIG. 1B, the substrate 26 is transferred to the unloading chamber. At this point the upper surface of the electrode 12 on which the substrate 26 was placed becomes exposed inside the reaction chamber 10. In this state, as described previously, there is a fear that deposits such as components separated from the reaction product produced in the reaction during etching may find their way into each of the openings 24 and adhere thereto (that is, adsorption or build-up).

In view of this, with the first embodiment, the master valve 21 and the fifth valve 130 are opened during the transfer of the substrate 26 so that cooling gas will be supplied from the gas supply source to each of the openings 24 in the electrode 12, and the gas supply prevents deposits from getting into the openings 24. The flux of cooling gas flowing to the cooling gas line 120 here is preferably low enough that the gas can be purged without placing a burden on the turbo pump (TP) 40 of the exhaust line 18. Specifically, the flux of cooling gas in the cooling gas line 120 should be controlled by the MFC 36 to the desired numerical value within a range of from $1.69 \times 10^{-1}$ to $8.45 \times 10^{-1}$ (Pa (m$^3$/s)). With the first embodiment, the optimal flux of cooling gas in the cooling gas line 120 is $1.69 \times 10^{-1}$ (Pa (m$^3$/s)).

The numbering of the openings 24 is omitted in FIG. 1B. Also, the arrows attached to the openings 24 indicate how the cooling gas supplied from the cooling gas line 120 passes through the openings 24 and flows into the reaction chamber 10. The sixth valve 132 is closed in the step shown in FIG. 1B.

The substrate 26 is transferred from the load lock chamber into the reaction chamber 10. More specifically, in the step shown in FIG. 1C, the master valve 21 and the fifth valve 130 are closed, and immediately after the supply of cooling gas to the openings 24 is complete, the substrate 26 transferred from the load lock chamber is placed on the electrode 12, as indicated by the white arrow in FIG. 1C. In the step shown in FIG. 1C, the sixth valve 132 is closed. Also, the number of the openings 24 is omitted in FIG. 1C.

As discussed above, with the first embodiment, deposits are prevented from getting into the openings 24 by supplying cooling gas from the gas supply line 120 during the non-etching period, which is the post-etching period shown in FIG. 1B. As a result, in the first embodiment the supply of cooling gas prevents the adhesion of deposits that find their way into the openings 24.

Furthermore, with the first embodiment, deposits can also be prevented from getting into the openings 24 by supplying cooling gas from the cooling gas line 120 in the pre-etching period by the same procedure as in the step described through reference to FIG. 1B. In this case, the supply of cooling gas in the non-etching period that is the pre-etching period prevents the adhesion of deposits that have found their way into the openings 24.

Second Embodiment

A second embodiment of the present invention will now be described hereinbelow. FIGS. 2A, 2B, 3A, and 3B are flow diagrams of the treatment steps in the second embodiment.

First, the constitution of the second embodiment will be described with reference to FIG. 2A. The constituent elements shown in FIGS. 2B, 3A, and 3B are the same as those described below.

The electrode deterioration prevention mechanism in this second embodiment has the same constitution as in the first embodiment already described through reference to FIG. 1A. Thus, in FIGS. 2A, 2B, 3A, and 3B, those constituent elements that are the same as in the first embodiment are numbered the same, and redundant description of these elements will be omitted except when special explanation is necessary.

In the second embodiment, a gas line 222 comprises a gas supply line 220 and the exhaust line 18. It is preferable for the exhaust line 18 to be constituted the same as in the first embodiment. Thus, that part of the constitution of the exhaust line 18 that is the same as in the first embodiment is numbered the same in FIG. 2A, and redundant description will be omitted.

The gas supply line 220 in the second embodiment is characterized by being equipped with a first cooling gas line 216 and a second cooling gas line 218 connected together in parallel between the openings 24 and the gas supply source. The first cooling gas line 216, which is one branch of the line, corresponds to the gas supply line 120 described through reference to FIGS. 1A to 1C in the first embodiment.

Therefore, the first cooling gas line 216 comprises a master valve 21a, a pressure gauge 38a, an MFC 36, and a fifth valve 130, in that order from the gas supply source side to the openings 24 side. These constituent elements operate the same as discussed above, and redundant description thereof will be omitted. The cooling gas used in the second embodiment is preferably a rare gas, just as in the conventional example described through reference to FIGS. 7A, 7B, 8A and 8B.

The second cooling gas line 218, which is the other branch of the line, comprises a master valve 21b, a pressure gauge 38b, a second valve 232, and a first valve 230, in that order from the gas supply source side to the openings 24 side. The second valve 232 and the pressure gauge 38b are provided as needed. The pressure of the second cooling gas line 218 can be controlled with this pressure gauge 38b.

Figure 2A:
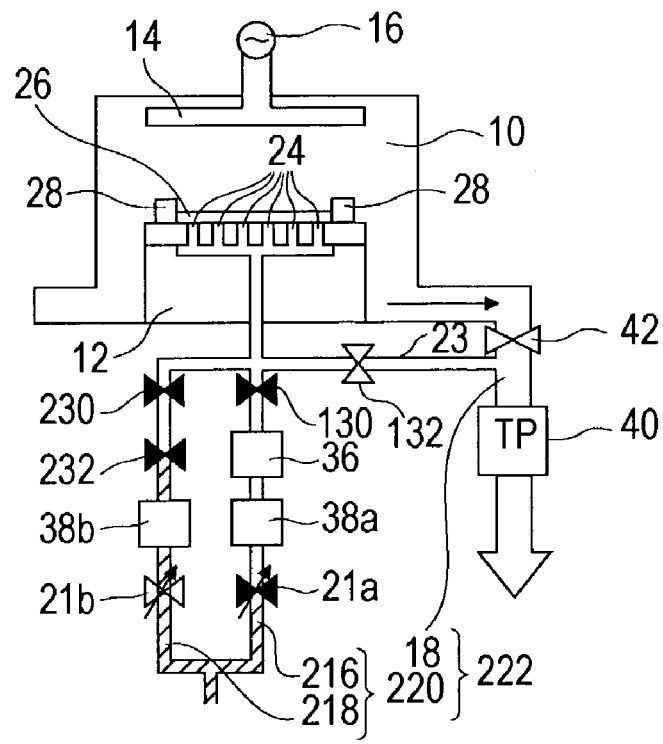
FIGS. 2A and 2B are flow diagrams of the treatment steps in a second embodiment of the electrode deterioration prevention method of the present invention.
Figure 2B:
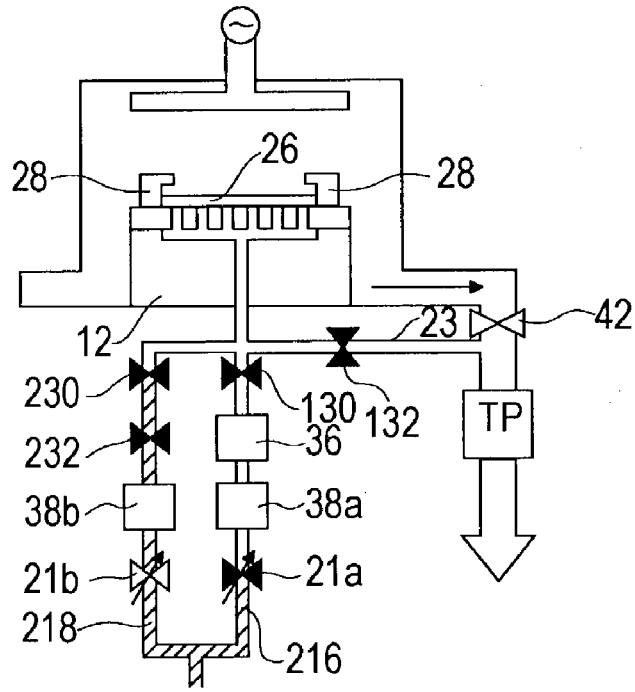
Figure 3A:
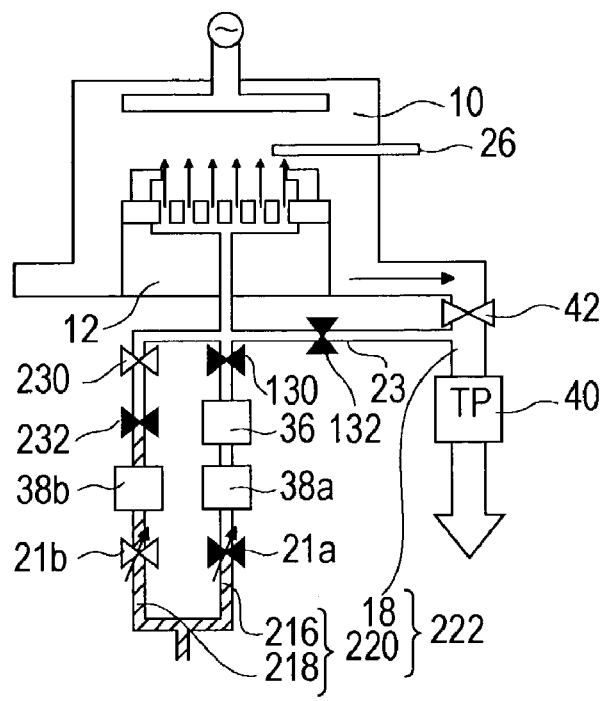
FIGS. 3A and 3B are flow diagrams continuing from FIG. 2B.
Figure 3B:
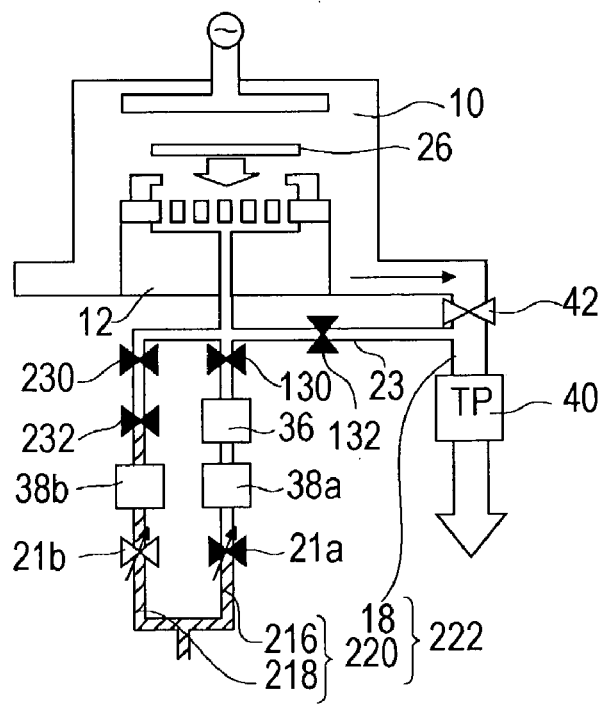

With the second embodiment, as shown in FIG. 2A, it is preferable for the fifth valve 130 to be provided following the openings 24 in the first cooling gas line 216. The first valve 230 of the second cooling gas line 218 is connected between the openings 24 and the fifth valve 130, as is the sixth valve 132.

Meanwhile, the first and second cooling gas lines 216 and 218 are connected to each other and linked to the gas supply source on the downstream side of the master valves 21a and 21b.

Further, in FIG. 2A, the line from the fifth valve 130 on, going toward the gas supply source with respect to the openings 24 along the first cooling gas line 216, is provided in parallel with the line from the first valve 230 on, going toward the gas supply source with respect to the openings 24 along the second cooling gas line 218. It is preferable if the line from the above-mentioned first valve 230 on in the second cooling gas line 218 is connected to the line from the fifth valve 130 on in the above-mentioned first cooling gas line 216, via the second valve 232 provided following the first valve 230.

Next, the operation of the various constituent elements in the electrode deterioration prevention mechanism of the second embodiment will be described through reference to FIGS. 2A and 3B. The steps shown in FIGS. 2A to 3B will be described for a case in which these steps are performed in the post-etching period described through reference to FIGS. 7A, 7B, 8A and 8B, just as in the first embodiment. Also, just as in FIGS. 1A to 1C, the unloading chamber and load lock chamber are not shown in FIGS. 2A, 2B, 3A, and 3B. The various valves here are again shown white when in an open state and black when closed.

First, the steps shown in FIGS. 2A and 2B will be described. FIG. 2A illustrates the same step as that described with reference to FIG. 8A above. In FIG. 2A, the exhaust valve 42 is open and the turbo pump 40 is operating. Meanwhile, the master valve 21a, the fifth valve 130, and the first valve 230 are closed, so that the supply of cooling gas to the openings 24 is shut off. In this state, the sixth valve 132 is opened to purge the cooling gas from between the plurality of openings 24 and the first valve 230 and fifth valve 130. It is also preferable if the second valve 232 is closed in the step shown in FIG. 2A.

Also, in the second embodiment, the master valve 21b is opened to supply cooling gas from the cooling gas supply source to the second valve 232 of the second cooling gas line 218. In the structure shown in FIG. 2A, the hatched portion of the second cooling gas line 218 is the portion filled with cooling gas. Since the master valve 21a is closed, everything up to the master valve 21a in the first cooling gas line 216 is filled with cooling gas.

The states of the various valves and the portions through which cooling gas flows are indicated with hatching in FIGS. 2B, 3A, and 3B, just as in FIG. 2A.

The sixth valve 132 is then closed and the step in FIG. 2A is complete, after which the second valve 232 is opened. In the structure of the second cooling gas line 218 as described above, when the second valve 232 is opened, the cooling gas flows to the first valve 230 provided following this valve 232. In the step in FIG. 2B, the second valve 232 is closed in a state in which the cooling gas has flowed to the first valve 230, so that the cooling gas fills the space between the first valve 230 and the second valve 232. The clamping apparatus 28 that fixes the etched substrate 26 on the electrode 12 is released.

After this the steps shown in FIGS. 3A and 3B are carried out. In the step in FIG. 3A, which is performed after the step in FIG. 2B, the substrate 26 is transferred to the unloading chamber. At this point the upper surface of the electrode 12 becomes exposed inside the reaction chamber 10, just as described previously in FIG. 1B. Consequently, there is the danger that deposits may find their way into the openings 24 and adhere thereto.

In view of this, with the second embodiment, the turbo pump 40 is operating and the exhaust valve 42 is open during the non-etching period, as shown in FIG. 3A. The first valve 230 is opened in this state. As a result, the cooling gas that filled the space between the first valve 230 and the second valve 232 in the step in FIG. 2B enters the openings 24 of the electrode 12. In FIG. 3A, the arrows attached to the openings 24 indicate how the cooling gas supplied from the second cooling gas line 218 passes through the openings 24. The cooling gas filling the space between the first valve 230 and the second valve 232 is under high pressure. The high-pressure cooling gas is supplied to the openings 24 in the second embodiment. Therefore, the effect of the second embodiment is that deposits are prevented from getting into the openings 24 while the upper surface of the electrode 12 is exposed inside the reaction chamber 10, and any deposits that do find their way into the openings 24 are blown out of the openings 24. The step in FIG. 3A is halted by closing the first valve 230. In the step in FIG. 3A, the master valve 21a, the fifth valve 130, the sixth valve 132, and the second valve 232 are closed. The master valve 21b, though, is open.

With the second embodiment, the gas line 222 is utilized to repeat the steps in FIGS. 2B and 3A until the substrate 26 has been conveyed from the load lock chamber into the reaction chamber 10. This prevents deposits from getting into the openings 24 during the non-etching period. This repeated performance of the steps in FIGS. 2B and 3A is called flushing.

After this, in the step shown in FIG. 3B, the first valve 230 is closed to conclude the supply of cooling gas to the openings 24. Immediately after this conclusion, the substrate 26 conveyed from the load lock chamber is placed on the electrode 12 as indicated by the white arrow in these drawings. Furthermore, in the step shown in FIG. 3B, the state of other valves besides the first valve 230 and that of the turbo pump remain the same as before. The master valve 21b, however, may be closed.

As described above, with the second embodiment, the same effect as in the first embodiment can be obtained by preventing deposits from getting into the openings 24. Also, with the second embodiment, any deposits that do find their way into the openings 24 can be repeatedly blown out of the openings 24 by flushing, which effectively prevents the deposits from adhering inside the openings 24.

Further, it is possible for the first cooling gas line 216 and the second cooling gas line 218 to consist of a single line with the second embodiment discussed above. Ill this case, the line will be structured the same as the cooling gas line 120 in the first embodiment shown in FIG. 1A. Here, it is preferable to use the fifth valve 130 as the first valve and to install the second valve on the MFC 36 side following the fifth valve 130. A structure such as this reduces the number of lines through which the cooling gas and so forth flow, and simplifies the apparatus.

Meanwhile, as described previously, the flux of the cooling gas is controlled by providing the MFC 36 to the first cooling gas line 216. If the first cooling gas line 216 and the second cooling gas line 218 consist of a single line as mentioned above, it is preferable for the pressure of the cooling gas to be low enough not to place a burden on the MFC 36. Here, with the structure described through reference to FIGS. 2A, 2B, 3A and 3B, since the first cooling gas line 216 and the second cooling gas line 218 are provided as separate lines, the cooling gas can be kept at the desired pressure in the second cooling gas line 218. Thus, compared to when the first cooling gas line 216 and the second cooling gas line 218 consist of a single line, a better effect can be obtained by flushing the cooling gas out of the openings 24 as discussed above.

Further, with the second embodiment, deposits may be prevented from getting into the openings 24 in the pre-etching period by the same procedure as in the steps described through reference to FIGS. 2B and 3A. In this case, any deposits that have found their way into the openings 24 can be prevented from adhering thereto in the pre-etching period.

Third Embodiment

A third embodiment of the present invention will now be described. FIGS. 4 and 5 illustrate the flow of steps pertaining to the third embodiment.

First, the constitution of the third embodiment will be described with reference to FIG. 4A. The constitution shown in FIGS. 4B, 5A, and 5B is the same as that described below.

The electrode deterioration prevention mechanism in the third embodiment is constituted the same as in the first embodiment described with reference to FIG. 1A above. Thus, in FIGS. 4A and 4B and FIGS. 5A and 5B, those constituent elements that are the same as in the first embodiment are numbered the same as in the first embodiment, and redundant description will be omitted.

In the third embodiment, a gas line 322 comprises a gas supply line 326 and the exhaust line 18. It is preferable for the exhaust line 18 to be constituted the same as in the first embodiment. Thus, that part of the constitution of the exhaust line 18 that is the same as in the first embodiment is numbered the same in FIG. 4A, and redundant description will be omitted.

Also, with the third embodiment, it is preferable if the gas supply line 326 comprises a cooling gas line 320 and a cleaning gas line 324. The cooling gas line 320 is connected to a cooling gas supply source (not shown), and the cleaning gas line is connected to a separate gas supply source (not shown).

The cleaning gas line 324 is connected between the cooling gas line 320 and the fifth valve 130 and openings 24. In this example, the structure other than the cleaning gas line 324 is the same as that of the cooling gas line 120 shown in FIGS. 1A to 1C, and the operation is also the same. Thus, the structure in FIG. 4A that is the same as that of the cooling gas line 120 is numbered the same in FIGS. 1A to 1C, and redundant description will be omitted. The cooling gas used in the third embodiment is preferably a rare gas, just as in the conventional example described through reference to FIGS. 7A, 7B, 8A and 8B.

Figure 4A:
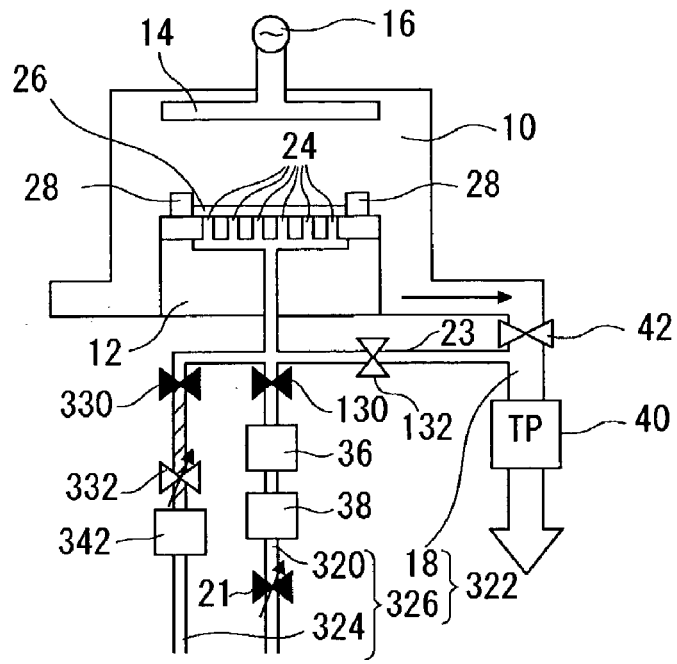
FIGS. 4A and 4B are flow diagrams of the treatment steps in a third embodiment of the electrode deterioration prevention method of the present invention.
Figure 4B:
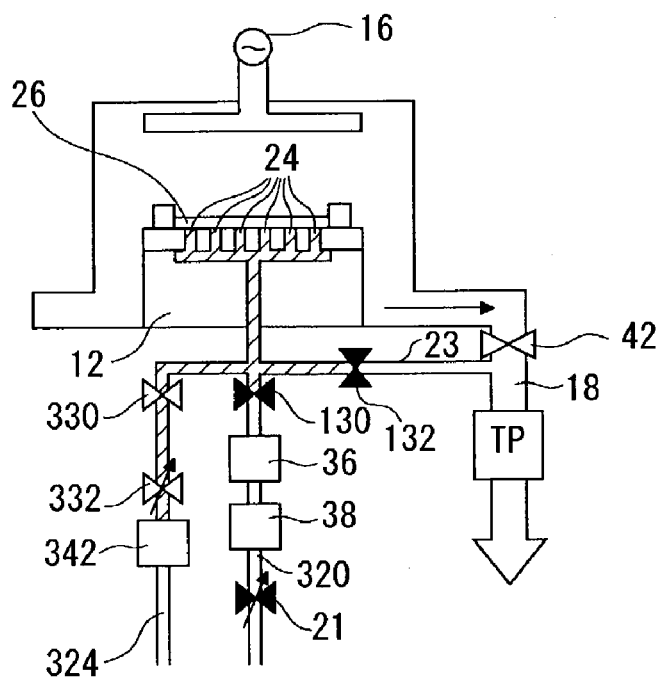
Figure 5A:
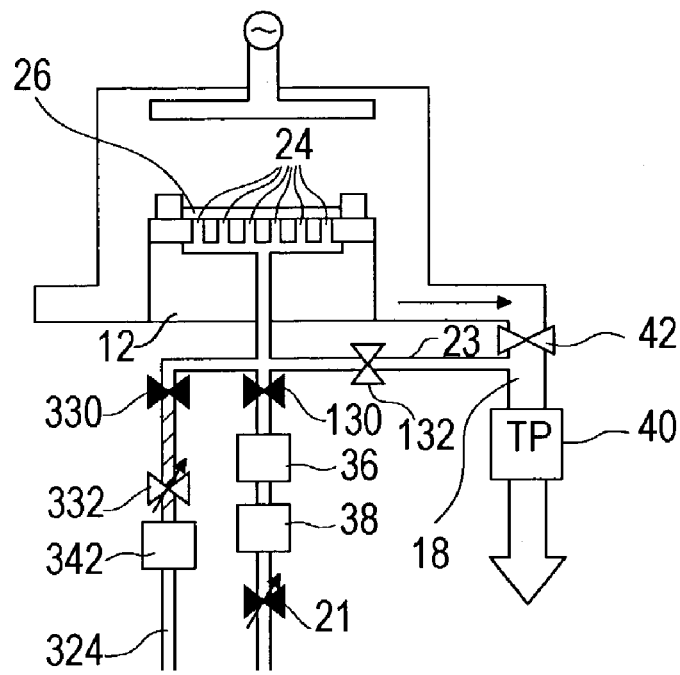
FIGS. 5A and 5B are flow diagrams continuing from FIG. 4B.
Figure 5B:
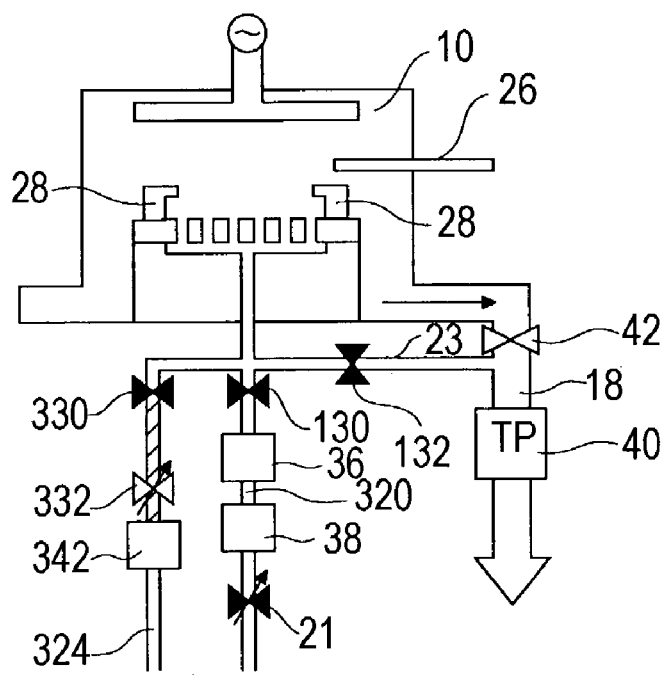

As shown in FIG. 4A, in the third embodiment the fifth valve 130 is provided following the plurality of openings 24 along the cooling gas line 320. The cooling gas line 320 is connected to the cleaning gas line 324 via the fifth valve 130.

Further, the line from the fifth valve 130 on, going toward the cooling gas supply source with respect to the plurality of openings 24 along the cooling gas line 320, is provided in parallel with the line from a seventh valve 330 on, going toward the cleaning gas supply source with respect to the plurality of openings 24 along the cleaning gas line 324. The cleaning gas line 324 comprises the seventh valve 330, an eighth valve 332, and a cleaning gas supply source 342 that forms and supplies active gas from the gas that comes in, with these components being provided in that order from the openings 24 side toward the cleaning gas supply source side. The cleaning gas supply source can instead be one in which active gas has already been stored, rather than one of the type that activates incoming gas.

Next, the operation of the various constituent elements in the electrode deterioration prevention mechanism of the third embodiment will be described through reference to the step flow shown in FIGS. 4A, 4B, 5A and 5B. The steps illustrated in FIGS. 4A, 4B, 5A, and 5B will be described for a case in which these steps are performed in the post-etching period following completion of the series of etching steps described through reference to FIGS. 7A, 7B, 8A and 8B, just as in the first embodiment. Also, just as in FIGS. 1A to 1C, the unloading chamber and load lock chamber are not shown in FIGS. 4A, 4B, 5A, and 5B.

First, the steps shown in FIGS. 4A and 4B will be described. FIG. 4A illustrates the same step as that described with reference to FIG. 8A above. In FIG. 4A, the master valve 21 and the fifth valve 130 of the cooling gas line 320 are closed. The seventh valve 330 of the cleaning gas line 324 is also closed. Therefore, the supply of cooling gas to the openings 24 is shut off. In this state, the sixth valve 132 is opened to purge the cooling gas from between the seventh valve 330 and fifth valve 130 and the plurality of openings 24.

Also, with the third embodiment, cleaning gas is supplied from the cleaning gas line 324 to the openings 24 through the seventh valve 330. The supply of cleaning gas from the cleaning gas line 324 will be described in detail below.

In the structure shown in FIG. 4A, the hatched portion of the cleaning gas line 324 is the portion filled with cleaning gas. In the step illustrated in FIG. 4A, the seventh valve 330 is closed and the eighth valve 332 is open, so the cleaning gas flows from the cleaning gas supply source 342 to the seventh valve 330.

The states of the various valves and the portions through which cleaning gas flows are indicated with hatching in FIGS. 4B, 5A, and 5B, just as in FIG. 4A.

Then, in the step in FIG. 4B, the sixth valve 132 is closed and the step in FIG. 4A is complete. The etched substrate 26 is fixed on the electrode 12, and the seventh valve 330 is opened while the fifth valve 130 remains closed. With the cleaning gas line 324 structure discussed above, the cleaning gas is supplied to the openings 24 when the seventh valve 330 is opened. At this point, as shown in FIG. 4B, the cleaning gas also flows between the fifth valve 130 and sixth valve 132 and the openings 24.

With the third embodiment, it is preferable to use a highly reactive gas such as ozone ($O_3$) as the cleaning gas. As described previously, deposits that could be adsorbed to or build up on the openings 24 during the non-etching period, in which no etching is performed, include separated components from the reaction product produced in the reaction during etching. Any deposits that do adsorb to or build up on the openings 24 will react with the cleaning gas when the cleaning gas flows into the openings 24. As a result, deposits adsorbed to or built up on the openings 24 are removed.

The step in FIG. 4B is concluded by closing the seventh valve 330. After this the steps shown in FIGS. 5A and 5B are performed.

In the step in FIG. 5A, the seventh valve 330 and the fifth valve 130 are closed. The substrate 26 is fixed on the electrode 12. In this state, the sixth valve 132 is opened so that the cleaning gas between the seventh valve 330 and fifth valve 130 and the openings 24 will be purged to the exhaust line 18. After this, the sixth valve 132 is closed and the step in FIG. 5A is complete. The eighth valve 332 may be closed at this point.

Then, in the step in FIG. 5B, the clamping apparatus 28 fixing the substrate 26 is released in a state in which the seventh valve 330, the fifth valve 130, and the sixth valve 132 are closed. The step in FIG. 5B is complete at the point when the substrate 26 is transferred to the unloading chamber. The eighth valve 332 may be closed at this point.

With the third embodiment, the same step as that described through reference to FIG. 1B in the first embodiment is carried out in the cooling gas line 320 in the step in FIG. 5B. Therefore, the third embodiment has the same effect as the first embodiment.

Furthermore, with the third embodiment, upon completion of the etching in the reaction chamber 10, as a post-etching step, cleaning gas is introduced through the procedure discussed above, and any deposits that have adsorbed to or built up on the openings 24 are removed. As a result, in the third embodiment, deposits can be effectively prevented from adhering to the openings 24 by removing deposits from the openings 24 as a post-etching step.

With the third embodiment described above, in the step shown in FIG. 5B, with the fifth valve 130 and the sixth valve 132 closed, it is also possible for the seventh valve 330 to be opened so that cleaning gas flows from the cleaning gas line 324 to the openings 24. In this case, since a highly reactive gas is used for the cleaning gas as mentioned above, the inside of the reaction chamber 10 must be thoroughly purged so that no cleaning gas remains prior to the etching of the substrate 26 conveyed in from the load lock chamber.

Also, with the third embodiment described through reference to FIGS. 4A to 4C and FIGS. 5A and 5B, it is possible for the cooling gas line 320 and the cleaning gas line 324 to be combined into a single gas supply line 326. In this case, the gas supply line 326 is constituted the same as the gas supply line 120 in the first embodiment shown in FIG. 1A. Therefore, with this constitution, either just the cooling gas or just the cleaning gas can be used as the gas that prevents the adsorption or build-up of deposits in the openings 24. Also, a structure such as this reduces the number of lines through which the cooling gas and so forth flow, and simplifies the apparatus.

Fourth Embodiment

The etching apparatus of the present invention will now be described as a fourth embodiment. The etching apparatus in the fourth embodiment has the electrode deterioration prevention mechanism previously described in the first to third embodiments. With this etching apparatus, upon completion of the series of etching steps described through reference to FIGS. 7A, 7B, 8A and 8B in the reaction chamber 10, the series of steps described in the first to third embodiments is carried out during the non-etching period.

As described above, the electrode deterioration prevention mechanism of the first to third embodiments prevents deposits from adhering to the plurality of openings 24 in the electrode 12. Thus, with the etching apparatus in the fourth embodiment, changes in the size, number, and layout of the plurality of openings 24 in the electrode 12 are suppressed, and therefore any decrease in the cooling efficiency of the substrate 26 during the etching performed in the reaction chamber 12, and any deterioration in the electrode 12 that would be caused by a change in the etching characteristics can be prevented.

Variation Examples

Figure 6A:
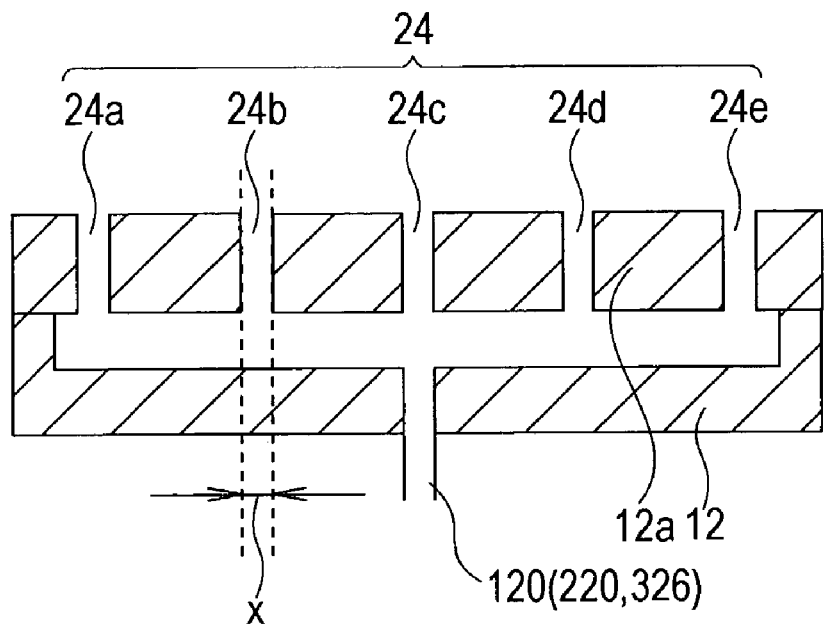
FIG. 6A is a diagram illustrating the shape of openings 24.

Variations on the present invention will now be described with reference to FIGS. 6A and 6B. FIG. 6A is a lateral cross section giving a detail view of the openings 24 in the electrode 12 in the various embodiments described above, and illustrates the shape of the openings 24.

Figure 6B:
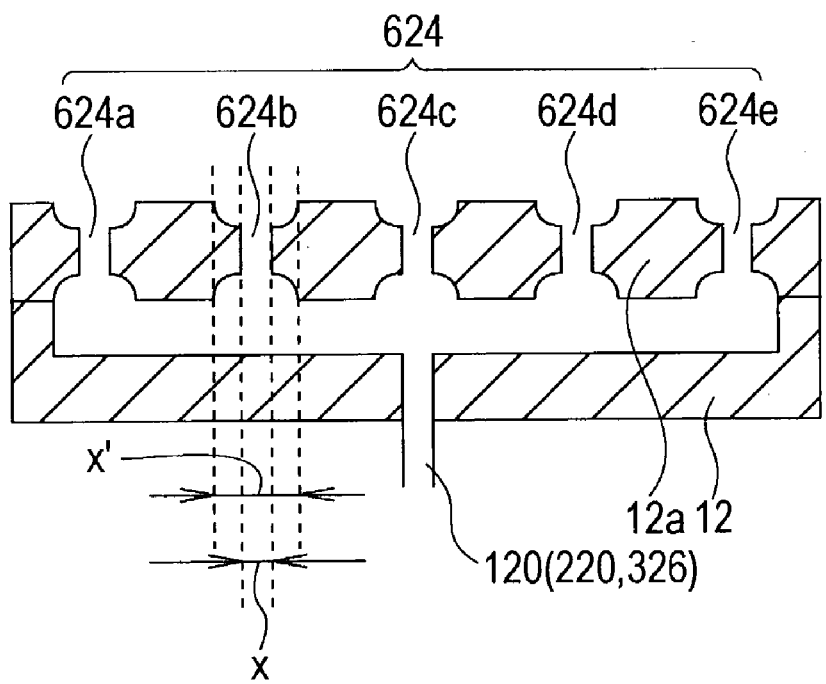
FIG. 6B is a diagram illustrating the shape of openings 624 in a variation example of the present invention.
Figure 7A:
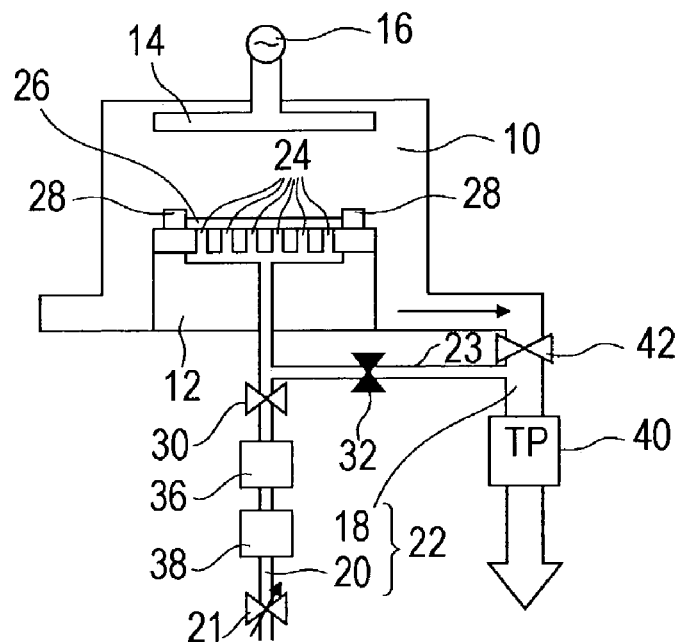
FIGS. 7A and 7B are flow diagrams of the treatment steps in a conventional electrode deterioration prevention method.
Figure 7B:
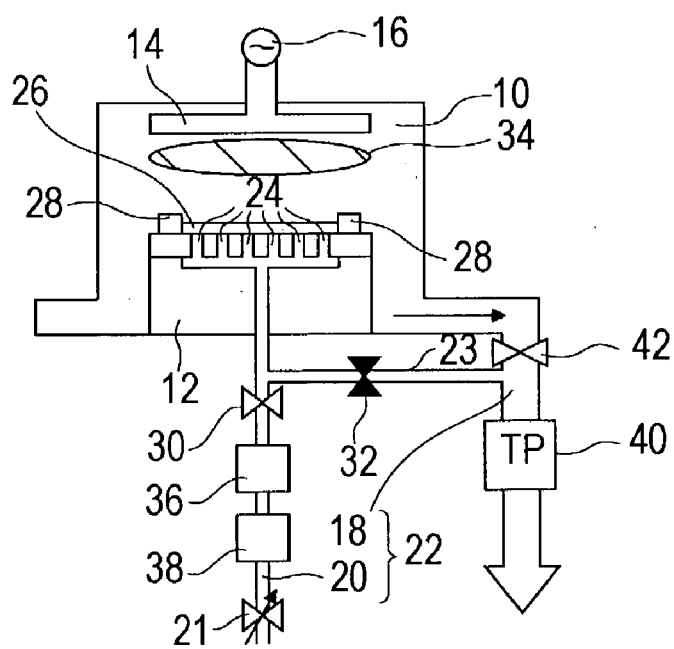

FIG. 6B is a lateral cross section giving a detail view of openings 624 in a variation example, and illustrates the shape of these openings 624.

As shown in FIG. 6A, the plurality of openings 24a, 24b, 24c, 24d, and 24e in the various embodiments described through reference to FIGS. 1A to 5B are provided to a substrate holder (also called a substrate support) of the electrode 12, parallel to each other and going through the gas supply line (120, 220, or 326). These openings are formed at a specific width x in the vertical direction, from the gas supply line side toward the top of the electrode 12, that is, toward the side of the electrode 12 facing the substrate 26. However, the shape of the openings 24 is not limited to that discussed above, and can also be as shown in FIG. 6B.

Of the plurality of openings 624$a$, 624$b$, 624$c$, 624$d$, and 624$e$ that make up the openings 624 shown in FIG. 6B, the structure of the single opening 624$b$ will be described. The other openings 624$a$, 624$c$, 624$d$, and 624$e$ shown in FIG. 6B are structured the same as this opening 624$b$ described below.

Just as with the openings 24 discussed above, the opening 624$b$ is provided vertically, from the gas supply line (120, 220, or 326) side toward the top of the substrate holder 12$a$ of the electrode 12. The width of the opening, though, is increased at the inlet and/or the outlet of the substrate holder 12$a$. Therefore, the width of the middle part of this opening is x, while the maximum expanded width at the inlet and outlet is x' (where x'>x). The shape of the inlet and outlet of the opening is, for example, a tapered curve, which varies continuously between the middle and the inlet or outlet.

If we look at the opening 24$b$, for instance, out of the plurality of openings shown in FIG. 6A, deposits gradually adhere in this opening 24$b$ during the non-etching period, from the top toward the bottom of the electrode 12. Therefore, a comparison of the opening 24$b$ and the opening 624$b$ reveals that the effect that the above-mentioned adherence of deposits has on the change in shape is less with the opening 624$b$ shown in FIG. 6B. The above-mentioned change in shape means a reduction in the width of the opening 24$b$ or the opening 624$b$ due to the adherence of deposits.

As described above, changes in the size, number, layout, and so forth of the openings caused by the adherence of deposits greatly affects the cooling efficiency of the substrate 26 and the etching characteristics. Thus, with this variation example shown in FIG. 6B, since the above-mentioned change in the shape of the opening 624$b$ is reduced, the effect that such change has on the etching characteristics and on the cooling efficiency of the substrate 26 can be minimized.

What is claimed is:

1. A method for preventing deterioration of an electrode that is provided in a reaction chamber of an etching apparatus, the electrode supports a substrate being etched and is provided with a plurality of openings, the method comprising:

providing a gas supply line communicating with each of the openings as including a first cooling gas line, and a second cooling gas line including a first valve provided on an electrode side of the gas supply line and a second valve provided on a gas supply source side of the gas supply line; and preventing deposits from adhering in the openings by repeating to fill a space between the first valve and the second valve with a cooling gas, and to supply the cooling gas filling said space through each of the plurality of openings in the electrode by opening the first valve after an etching treatment until a next substrate has been conveyed into the reaction chamber.

2. The method for preventing deterioration of an electrode in an etching apparatus according to claim 1, further comprising:

purging the cooling gas or an exhaust gas from the reaction chamber through an exhaust line communicating with the gas supply line.

3. The method for preventing deterioration of an electrode in an etching apparatus according to claim 2, further comprising:

using the cooling gas for cooling the substrate during etching, the cooling gas being supplied via the gas supply line.

4. The method for preventing deterioration of an electrode in an etching apparatus according to claim 3, further comprising:

controlling flow of the cooling gas after the etching treatment until the next substrate has been conveyed into the reaction chamber to between $1.69 \times 10^{-1}$ and $8.45 \times 10^{-1}$ Pa (m$^3$/s) using a mass flow controller provided along the gas supply line.

5. The method for preventing deterioration of an electrode in an etching apparatus according to claim 3, further comprising:

precharging the cooling gas between the first valve and the second valve.

6. The method for preventing deterioration of an electrode in an etching apparatus according to claim 2, further comprising:

supplying the cooling gas from the first cooling gas line for cooling the substrate during etching; and supplying the cooling gas precharged in the second cooling gas line between the first valve and the second valve after the etching treatment until the next substrate has been conveyed into the reaction chamber.

7. The method for preventing deterioration of an electrode in an etching apparatus according to claim 5, further comprising repeating to supply the cooling gas a specific number of times during said preventing deposits.

8. The method for preventing deterioration of an electrode in an etching apparatus according to claim 6, wherein said supplying the cooling gas from the first cooling gas line and said supplying the cooling gas from the second cooling gas line are each repeated a specific number of times.

9. The method for preventing deterioration of an electrode in an etching apparatus according to claim 2, further comprising supplying a cleaning gas from a cleaning gas supply line.

10. The method for preventing deterioration of an electrode in an etching apparatus according to claim 3, further comprising:

providing the gas supply line as including a cleaning gas line; and supplying cleaning gas from the cleaning gas line to each of the openings in a state in which the substrate is supported on the electrode after the etching treatment until the next substrate has been conveyed into the reaction chamber.

11. The method for preventing deterioration of an electrode in an etching apparatus according to claim 1, further comprising:

purging another gas through the plurality of openings before etching of the substrate, to prevent deposits from adhering to the plurality of openings.

12. The method for preventing deterioration of an electrode according to claim 11, wherein the another gas is the cooling gas.

13. The method for preventing deterioration of an electrode according to claim 12, further comprising:

supplying the cooling gas through the plurality of openings to cool the substrate during etching.

14. The method for preventing deterioration of an electrode according to claim 11, wherein the another gas is a cleaning gas.

15. The method for preventing deterioration of an electrode according to claim 14, further comprising:

supplying the cooling gas through the plurality of openings to cool the substrate during etching.

* * * * *